United States Patent
Chen et al.

(10) Patent No.: US 6,737,333 B2
(45) Date of Patent: May 18, 2004

(54) SEMICONDUCTOR DEVICE ISOLATION STRUCTURE AND METHOD OF FORMING

(75) Inventors: Zhihao Chen, Plano, TX (US); Douglas T. Grider, McKinney, TX (US); Freidoon Mehrad, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/176,383

(22) Filed: Jun. 20, 2002

(65) Prior Publication Data

US 2003/0006476 A1 Jan. 9, 2003

Related U.S. Application Data

(60) Provisional application No. 60/302,955, filed on Jul. 3, 2001.

(51) Int. Cl.$^7$ ................................ H01L 21/76
(52) U.S. Cl. ................ 438/424; 438/435; 438/778
(58) Field of Search .................. 438/424, 435, 438/778, FOR 227

(56) References Cited

U.S. PATENT DOCUMENTS

| | | | | |
|---|---|---|---|---|
| 5,801,082 A | * | 9/1998 | Tseng | ............ 438/424 |
| 6,020,230 A | * | 2/2000 | Wu | ............ 438/222 |
| 6,214,735 B1 | * | 4/2001 | Kim et al. | ............ 438/703 |
| 6,417,073 B2 | * | 7/2002 | Watanabe | ............ 438/424 |
| 6,479,369 B1 | * | 11/2002 | Miyoshi | ............ 438/435 |

FOREIGN PATENT DOCUMENTS

| | | | | | |
|---|---|---|---|---|---|
| JP | 62106645 A | * | 5/1987 | ............ | H01L/21/76 |
| JP | 03234041 A | * | 10/1991 | ............ | H01L/21/76 |

* cited by examiner

*Primary Examiner*—George Fourson
*Assistant Examiner*—Michelle Estrada
(74) *Attorney, Agent, or Firm*—Yingsheng Tung; Wade James Brady, III; Frederick J. Telecky, Jr.

(57) ABSTRACT

A method for isolating semiconductor devices includes forming a first oxide layer outwardly from a semiconductor substrate, forming a first nitride layer outwardly from the first oxide layer, removing a portion of the first nitride layer, a portion of the first oxide layer, and a portion of the substrate to form a trench isolation region, forming a second oxide layer in the trench isolation region, forming a spin-on-glass region in the trench isolation region, annealing the spin-on-glass region, removing a portion of the spin-on-glass region to expose a shallow trench isolation region, and forming a third oxide layer in the shallow trench isolation region.

12 Claims, 2 Drawing Sheets

SEMICONDUCTOR DEVICE ISOLATION STRUCTURE AND METHOD OF FORMING

This application claims priority under 35 USC §19(e)(1) of provisional application No. 60/302,955 filed Jul. 3, 2001.

TECHNICAL FIELD OF THE INVENTION

The present invention relates generally to the field of semiconductor devices and, more particularly, to a semiconductor device isolation structure and method of forming.

BACKGROUND OF THE INVENTION

Semiconductor devices are used in many electronic applications. One type of semiconductor device is a transistor. Manufacturers of transistors are continually reducing the size of transistors to increase their performance and to manufacture electronic devices in smaller sizes.

When many transistors are manufactured on a single integrated circuit die, oftentimes leakage current increases and breakdown voltage decreases, which severely degrades transistor performance. Manufacturers of transistors use isolation methods between transistors and other semiconductor devices to address these problems and others.

Shallow Trench Isolation ("STI") is one method used for isolating transistors and other semiconductor devices. However, as transistor geometry shrinks, STI falls short of providing adequate isolation.

SUMMARY OF THE INVENTION

According to one embodiment of the invention, a method for isolating semiconductor devices includes forming a first oxide layer outwardly from a semiconductor substrate, forming a first nitride layer outwardly from the first oxide layer, removing a portion of the first nitride layer, a portion of the first oxide layer, and a portion of the substrate to form a trench isolation region, forming a second oxide layer in the trench isolation region, forming a spin-on-glass region in the trench isolation region, annealing the spin-on-glass region, removing a portion of the spin-on-glass region to expose a shallow trench isolation region, and forming a third oxide layer in the shallow trench isolation region.

Embodiments of the invention provide a number of technical advantages. Embodiments of the invention may include all, some, or none of these advantages. According to one embodiment, semiconductor device isolation is improved while eliminating a channel stop implant. This elimination reduces junction capacitance, resulting in faster devices. In that embodiment, such advantages are achieved without stringent lithographic alignment requirements.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Figure 1:
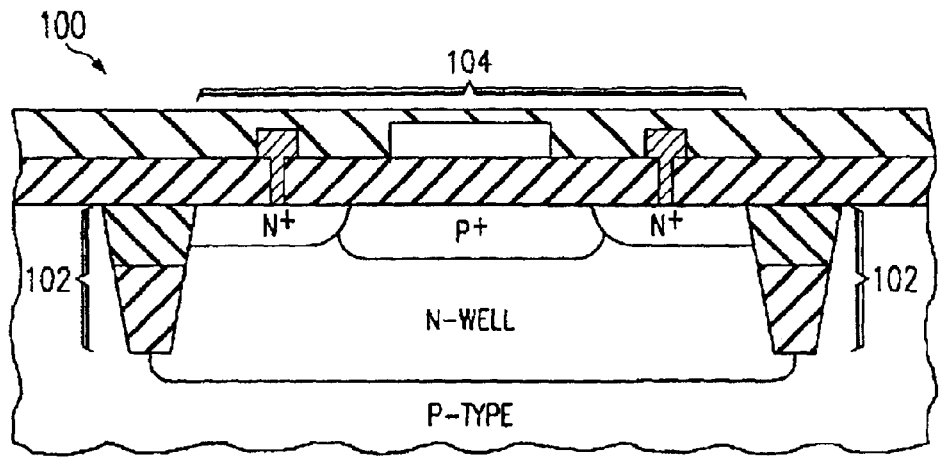
FIG. 1 is a cross-sectional view of a partially completed semiconductor device showing a pair of isolation regions manufactured according to the teachings of the present invention.
Figure 2A:
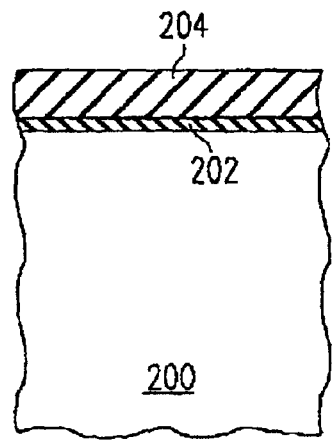
FIGS. 2A–2F are a series of cross-sectional views illustrating various manufacturing stages of an isolation region in accordance with the teachings of the present invention.
Figure 2B:
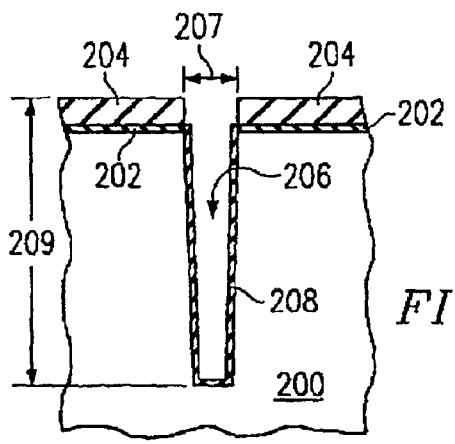
Figure 2C:
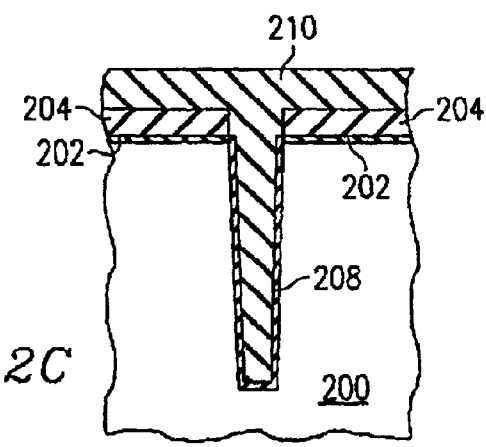
Figure 2D:
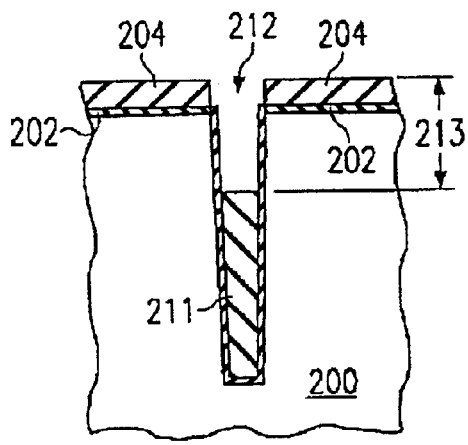
Figure 2E:
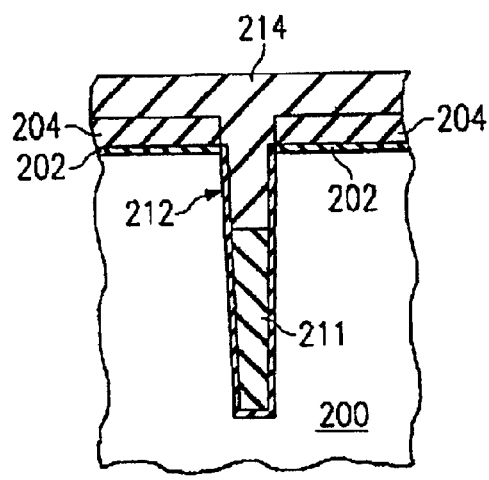
Figure 2F:
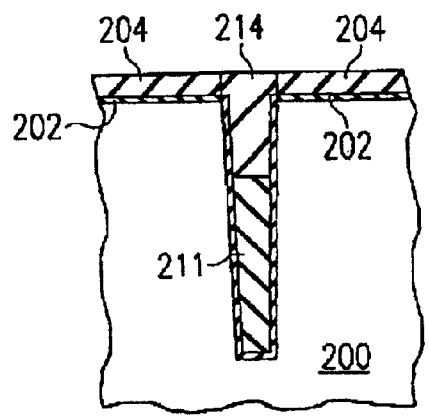

Example embodiments of the present invention and their advantages are best understood by referring now to FIGS. 1 through 2F of the drawings, in which like numerals refer to like parts.

FIG. 1 is a cross-sectional view of a partially completed semiconductor chip 100 showing a pair of trench isolation regions 102 isolating a semiconductor device 104 from other semiconductor devices 104 (not explicitly shown). Semiconductor device 104 is any suitable semiconductor device, such as a bipolar junction transistor, an NMOS transistor, a PMOS transistor, a diode, a resistor, or a capacitor.

Semiconductor devices, especially transistors, are continually being reduced in size to increase their performance. Some problems arise when reducing the size of transistors and other semiconductor devices. For example, an increase in leakage current and a decrease in breakdown voltage may occur when many transistors are manufactured on a single integrated circuit die, which may severely degrade performance of integrated circuits. The present invention addresses these problems, and others, by providing a method for isolating semiconductor devices. One embodiment of such a method is illustrated in FIGS. 2A–2F.

FIGS. 2A–2F are a series of cross-sectional views illustrating various manufacturing stages of trench isolation region 102 in accordance with the teachings of the present invention.

FIG. 2A shows a substrate 200 having a first oxide layer 202 formed outwardly therefrom and a first nitride layer 204 formed outwardly from first oxide layer 202. Substrate 200 may be formed from any suitable material used in semiconductor chip fabrication, such as silicon or germanium. First oxide layer 202 comprises any suitable type of oxide and is formed using any suitable growth and/or deposition technique used in semiconductor processing. In one embodiment, first oxide layer 202 is referred to as a "pad ox" and is approximately 100 angstroms thick; however, other suitable thicknesses may be used. In one embodiment, first nitride layer 204 is formed from any suitable type of nitride using any suitable growth and/or deposition technique used in semiconductor processing; however, first nitride layer 204 may be formed from other suitable materials that act as a dielectric. In one embodiment, first nitride layer 204 is approximately 2000 angstroms thick; however, other suitable thicknesses may be used.

Although FIG. 2A describes first oxide layer 202 and first nitride layer 204 as being separate dielectric layers, in other embodiments, only one dielectric layer is grown and/or deposited on substrate 200. For example, a layer of oxide only or another suitable dielectric layer only may be grown and/or deposited on substrate 200.

FIG. 2B shows a trench isolation region 206 and a second oxide layer 208 formed in trench isolation region 206. In one embodiment, trench isolation region 206 is formed as follows: A photoresist layer (not explicitly shown) is applied to the outer surface of first nitride layer 204. The photoresist layer is then masked and selectively stripped using suitable photolithographic techniques to expose a portion of first nitride layer 204. The exposed portion is then etched using any suitable etching technique to remove the exposed portion of first nitride layer 204 and a portion of first oxide layer 202. The photoresist layer is then stripped and removed. After stripping and removing the photoresist layer, an anisotropic dry etch is performed on the exposed portion of substrate 200 to etch substrate 200 down to a predetermined depth 209. In this anisotropic dry etch process first nitride layer 204 is used as a hard masking layer. Any suitable anisotropic dry etch process, such as a plasma etch, may be used to define trench isolation region 206. In one embodiment, trench isolation region 206 has depth 209 between approximately 0.7 microns and 1.3 microns and a width 207 between approximately 0.1 microns and 0.13 microns. In a more particular embodiment, depth 209 is approximately 1 micron and width 207 is approximately 0.12 microns.

After defining trench isolation region 206, second oxide layer 208 is formed in trench isolation region 206. Second oxide layer 206 comprises any suitable type of oxide and is formed using any suitable growth and/or deposition technique used in semiconductor processing. In one embodiment, second oxide layer 208 is approximately 150 angstroms thick; however, other suitable thicknesses may be used.

According to the teachings of the present invention, a spin-on-glass ("SOG") region 211 is formed in trench isolation region 206 for isolating semiconductor devices 104. One method of forming SOG region 211 in trench isolation region 206 is outlined below in conjunction with FIGS. 2C and 2D.

FIG. 2C shows an SOG layer 210 formed in trench isolation region 206 and outwardly from first nitride layer 204. SOG is well known in the art of semiconductor fabrication. The "glass" used in SOG is typically silicon dioxide; however, other suitable silicates may be used. In one embodiment, the application of SOG layer 210 involves applying a liquid mixture of silicon dioxide, or other suitable silicate, in a solvent while the associated wafer containing semiconductor chip 100 is spun. Because of the relatively small width 207 of trench isolation region 206, dielectric materials other than those applied as SOG will experience difficulties when trying to fill trench isolation region 206. Polysilicon could be used to fill trench isolation region 206; however, polysilicon has a low dielectric strength and is inadequate for isolating semiconductor devices 104 manufactured close to one another. One technical advantage of the present invention is that SOG layer 210, which has adequate dielectric properties, is able to fill trench isolation region 206 even though a small width 207 is utilized.

After filling trench isolation region 206 with SOG layer 210, SOG layer 210 is annealed to evaporate the solvent in the SOG material so that SOG layer 210 may be cured. In one embodiment, annealing SOG layer 210 includes placing semiconductor chip 100 into an oven that is heated to a temperature between approximately 300° C. and 400° C. for a time period between approximately 15 and 30 minutes, and then subsequently raising the temperature to between 900° C. and 1000° C. for a time period between approximately 5 and 10 minutes. In a particular embodiment, the oven is heated to a temperature of approximately 400° C. for a time period of approximately 30 minutes, followed by raising the temperature to approximately 1000° C. for a time period between approximately 5 and 10 minutes.

FIG. 2D shows a portion of SOG layer 210 removed to define SOG region 211 and to expose a shallow trench isolation ("STI") region 212. In one embodiment, STI region 212 is formed by using a plasma dry etch process that etches SOG layer 210 down to a desired depth 213. This plasma dry etch process is highly selective, which reduces the thickness of SOG layer 210 with only a negligible reduction in thickness of first nitride layer 204. Other suitable etching processes may be used to reduce the thickness of SOG layer 210 to depth 213. In one embodiment, depth 213 is between approximately 2000 angstroms and 2700 angstroms. In a particular embodiment, depth 213 is approximately 2000 angstroms.

FIG. 2E shows a third oxide layer 214 formed in STI region 212. Third oxide layer 214 comprises any suitable type of oxide and is formed using any suitable growth and/or deposition technique used in semiconductor processing. For example, an atmospheric pressure chemical vapor deposition ("APCVD") process may be used to form third oxide layer 214.

FIG. 2F shows trench isolation region 102 after third oxide layer 214 is reduced in thickness by any suitable process, such as a chemical mechanical polish ("CMP") process. First nitride layer 204 is used as a stopping layer for the CMP process, which may result in a reduction in thickness of first nitride layer 204. After reducing the thickness of third oxide layer 214, semiconductor devices 104 may then be fabricated on semiconductor chip 100 in any suitable manner. Because of the excellent isolation that trench isolation regions 102 provide, based in part on SOG regions 211, semiconductor devices 104 may be fabricated closer to one another, thereby improving speed and performance of semiconductor devices 104 while ensuring that problems, such as an increase in current leakage or a decrease in breakdown voltage, are substantially reduced or eliminated.

Although embodiments of the invention and their advantages are described in detail, a person skilled in the art could make various alterations, additions, and omissions without departing from the spirit and scope of the present invention as defined by the appended claims.

What is claimed is:

1. A method for isolating semiconductor devices, the method comprising:
    forming a first oxide layer outwardly from a semiconductor substrate;
    forming a first nitride layer outwardly from the first oxide layer;
    removing a portion of the first nitride layer, a portion of the first oxide layer, and a portion of the substrate to form a trench isolation region;
    forming a second oxide layer in the trench isolation region;
    forming a spin-on-glass region in the trench isolation region;
    annealing the spin-on-glass region;
    removing a portion of the spin-on-glass region to expose a shallow trench isolation region; and
    forming a third oxide layer in the shallow trench isolation region.

2. The method of claim 1, wherein the trench isolation region has a depth between approximately 0.7 microns and 1.3 microns and a width between approximately 0.1 microns and 0.13 microns.

3. The method of claim 1, wherein the trench isolation region has a depth of approximately one micron and a width of approximately 0.12 microns.

4. The method of claim 1, wherein annealing the spin-on-glass region comprises annealing the spin-on-glass region at a temperature between approximately 300° C. and 400° C. for a time period between approximately 15 and 30 minutes, and then annealing the spin-on-glass region at a temperature between approximately 900° C. and 1000° C. for a time period between approximately 5 and 10 minutes.

5. The method of claim 1, wherein annealing the spin-on-glass region comprises annealing the spin-on-glass region at a temperature of approximately 400° C. for a time period of approximately 30 minutes, and then annealing the spin-on-glass region at a temperature of approximately 1000° C. for a time period between approximately 5 and 10 minutes.

6. The method of claim 1, wherein the shallow trench isolation region has a depth between approximately 2000 Å and 2700 Å.

7. The method of claim 1, wherein the shallow trench isolation region has a depth of approximately 2000 Å.

8. The method of claim 1, wherein forming the second oxide layer in the trench isolation region comprises forming the second oxide layer with a thickness of approximately 150 Å.

9. A method for isolating semiconductor devices, the method comprising:

forming a first oxide layer outwardly from a semiconductor substrate;

forming a first nitride layer outwardly from the first oxide layer;

removing a portion of the first nitride layer, a portion of the first oxide layer, and a portion of the substrate to form a trench isolation region having a depth between approximately 0.7 microns and 1.3 microns and a width between approximately 0.1 microns and 0.13 microns;

forming a second oxide layer in the trench isolation region;

forming a spin-on-glass region in the trench isolation region;

annealing the spin-on-glass region at a temperature between approximately 300° C. and 400° C. for a time period between approximately 15 and 30 minutes, and then annealing the spin-on-glass region at a temperature between approximately 900° C. and 1000° C. for a time period between approximately 5 and 10 minutes;

removing a portion of the spin-on-glass region to expose a shallow trench isolation region having a depth between approximately 2000 Å and 2700 Å;

forming a third oxide layer in the shallow trench isolation region; and polishing the third oxide layer by utilizing a chemical mechanical polishing technique.

10. The method of claim 9, wherein the trench isolation region has a depth of approximately one micron.

11. The method of claim 9, wherein annealing the spin-on-glass region comprises annealing the spin-on-glass region at a temperature of approximately 400° C. for a time period of approximately 30 minutes, and then annealing the spin-on-glass region at a temperature of approximately 1000° C. for a time period between approximately 5 and 10 minutes.

12. The method of claim 9, wherein the shallow trench isolation region has a depth of approximately 2000 Å.

* * * * *